DIODE HAVING LARGE CAPACITANCE CHANGE RELATED TO MINIMAL APPLIED VOLTAGE

Filed Sept. 28, 1967

INVENTORS.
JAMES W. MAYER,
ROBERT W. BOWER,
GORDON A. SHIFRIN,
BY
W H McAllister Jr
ATTORNEY.

United States Patent Office 3,483,443

Patented Dec. 9, 1969

3,483,443

DIODE HAVING LARGE CAPACITANCE CHANGE RELATED TO MINIMAL APPLIED VOLTAGE

James W. Mayer, Pasadena, Robert W. Bower, Palos Verdes, and Gordon A. Shifrin, Malibu, Calif., assignors to Hughes Aircraft Company, Culver City, Calif., a corporation of Delaware Filed Sept. 28, 1967, Ser. No. 671,306
Int. Cl. H01l 9/00, 3/22
U.S. Cl. 317—234 15 Claims

ABSTRACT OF THE DISCLOSURE

A diode fabricated by the implantation of ions to a prescribed depth in a surface-exposed, sub-surface region of the substrate and having a non-injecting contact deposited upon said implantation in order to effect in use an inordinately large capacitance change with minimal applied voltage.

This invention relates to solid state diodes and more particularly to such diodes including therein an ion-implanted region. The device of the invention is especially useful where it is desired to employ a diode with specific and controlled capacitance:voltage characteristics.

Among the preferred embodiments of the device of the invention, but in no case limited thereto, is a class of diodes often referred to as "varactor" diodes. A varactor diode conventionally is a variable capacitor or a pn-junction semiconductor device operating in a variable reactance conformation. Such devices are known in the art and the structure and operation thereof have been amply described, especially by Uhlir in U.S. Patent 2,884,607 issued Apr. 28, 1959, where in a semiconductor diode the capacitance, defined as the rate of change of charge as voltage is changed, depends upon the voltage; and by Doucette et al. in U.S. Patents 2,964,648 issued Dec. 13, 1960 and 2,989,650 issued June 20, 1961, where, in a semiconductor variable capacitor, in one case a relatively small change in bias voltage engenders a comparatively large capacitance change across the device; and in the other case a greater capacitance change for a given voltage permits thereby more rapid tuning of the circuit.

Further, structure and operation have been described by Barnes et al. in U.S. Patent 2,989,671 issued June 20, 1961, where a fused junction silicon semiconductor diode is provided for use s a voltage-sensitive crystal capacitor; by Götzberger in U.S. Patent 2,993,155 issued July 18, 1961, where the voltage-dependent capacitance of a pn-junction is made in a predetermined manner dependent upon the blocking voltage; by Lehovec in U.S. Patent 2,991,371 issued July 4, 1961, where in a semiconducting junction-type capacitor an extremely rapid change of capacitance with applied bias voltage derives from variations of the area of the junction and the width of the space charge layer; and by Messenger in U.S. Patent 3,148,283 issued Sept. 8, 1964, where a voltage-sensitive capacitor employs a reverse biased junction and a floating center wafer operating with either or both polarities of potential applied across it while maintaining a high value of effective parallel resistance and low electrical losses in the device.

Still further, structure and operation have been described by Atalla et al. in U.S. Patent 3,176,151 issued Mar. 30, 1965, wherein a varactor diode a particularly sensitive capacitance-voltage characteristic exists under reverse bias conditions when the semiconductor wafer includes a bulk portion of one conductivity-type and an epitaxially grown surface portion of the opposite conductivity type defining therebetween a pn-junction.

It should be noted herewith that in no patent cited, or in connection with the operation of the device thereof, is there any indication of a varactor diode structure which does not rely upon pn-junctions, whereas in the present invention a pn-junction is employed as only one alternative structure. Nor is there in the patents cited any indication of a structure which, by means of precise and specifically controlled fabrication of the depth of the conductivity-type impurity layer in or on a semiconductor body and a surface barrier deposited thereupon, produces an inordinately large capacitance change with minimal applied voltage (Doucette et al. as previously cited employ a bias voltage); nor is any structure shown which permits integration of such an inordinately large capacitance change per unit area. Further, no such device of prior art is fabricated by ion implantation means.

Hence novelty appears to reside at least in part in the present invention not only in a novel use of the technique of ion implantation, but also in the improved and unique performance characteristics significantly deriving therefrom. Operation of the device of the invention and the performance characteristics thereof will be described in detail after a brief discussion of the ion implantation technique employed and a description of the structure of a preferred embodiment of the present invention.

It is known to those skilled in the art that ion implantation is the only technique which, for varactor diode fabrication, permits a sufficiently low and controlled surface concentration of conductivity-determining impurities on a semiconductor substrate, precisely positioned, and at as minimal depth as the order of $0.1\mu$. In an ion implantation process, the impurity atoms are first ionized, then by means of divers electric and/or magnetic fields these ions may be formed into beams of various diameters and shapes and may also be caused to travel in predetermined directions at predetermined velocities. Hence in direct contrast to a conventional diffusion process—where available atoms are usually in vapor state, and may make contact with an exposed surface of a semiconductor body only in accordance with thermodynamic conditions present—conductivity-determining impurity ions may be made to enter a semiconductor surface film lattice in a predetermined direction at a predetermined velocity, and may be placed precisely therein in a prescribed concentration and controlled to a desired degree of uniformity or gradation.

It is therefore an object of the present invention to provide an improved diode.

Another object of the invention is to provide a diode fabricated by means of an ion implantation technique.

A further object of the invention is to provide a varactor diode characterized by an inordinately large capacitance variation with applied voltage.

Still another object of the invention is to provide a varactor diode having an N-type substrate with a surface-exposed, sub-surface region implanted with N-type ions, a metallic barrier evaporated upon the substrate surface contiguous to, or touching, the ion-implanted region, and an ohmic contact positioned on the reverse face of the substrate.

Yet another object of the invention is to provide an improved method of fabricating a diode.

These and other objects and advantages of the invention are realized in a diode structure by employing in one embodiment a gold (Au) surface barrier on a tellurium (Te) ion-implanted gallium arsenide (GaAs) substrate, the implanted ions being referred to hereinafter as "dopant." It is to be understood that any other substrate of semi-conductor material as silicon (Si), for example, capable of supporting a non-injecting contact as a surface barrier serves as effectively as gallium arsenide; that any other metallic surface barrier as platinum (Pt), for example, on an N-type substrate such as gallium arsenide or N-type silicon, for example, modulates the density thereof and serves as effectively as gold; and that any other N-type dopant in Group VI of the Periodic Table of the Elements serves as effectively as tellurium. It is further understood that in the use and application of the present invention a P-type substrate as P-type silicon, for example, serves effectively, providing the surface barrier, is, for example, aluminum or molybdenum.

The invention will be described in greater detail by reference to the drawings in which.

Figures 1, 2:
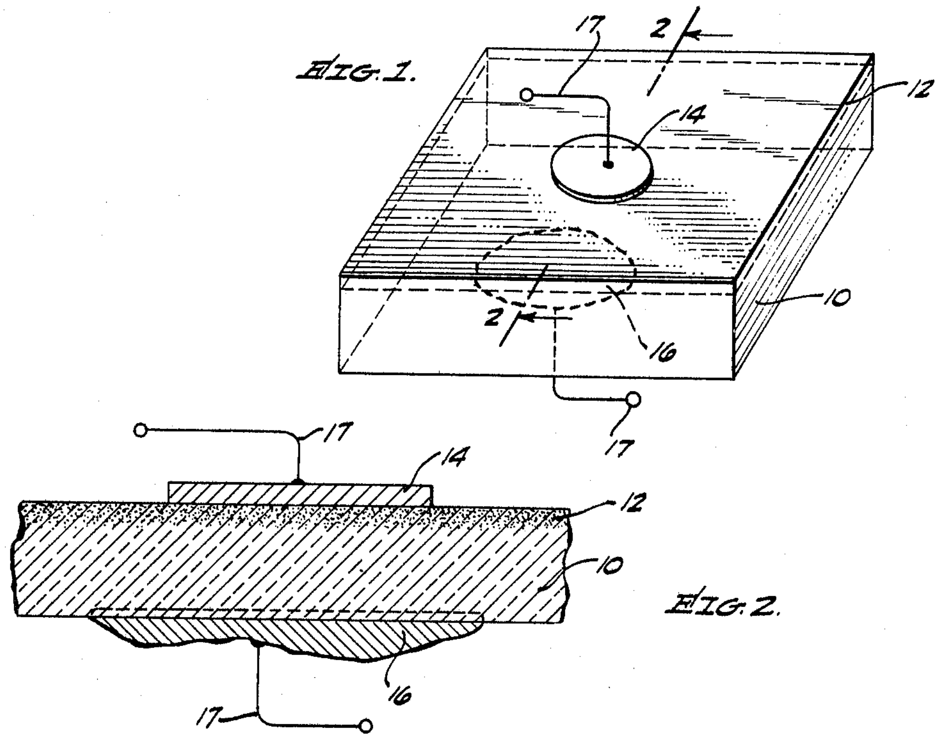
FIGURE 1 is a cross-sectional, perspective view of a varactor diode according to the invention.
FIGURE 2 is a cross-sectional, elevational view of the device along the line of 2—2 thereof.

Referring now to FIGURES 1 and 2, the structure of the varactor diode of the invention will be described in detail. An N-type substrate 10, which may be of gallium arsenide, for example, in a preferred embodiment of the invention, includes a region 12 which is implanted with N-type ions of tellurium to a depth on the order of 0.1 micron. The substrate 10 supports on the surface contiguous to said ion implantation a metallic barrier 14 constituted by a layer of gold formed by evaporation, for example. An ohmic contact 16 of gold-tin alloy is in an electrically conductive relationship with the reverse surface of said N-type substrate 10. Leads 17 are conventionally bonded to the structure.

Figure 3:
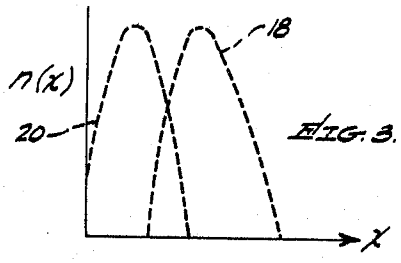
FIGURE 3 is a graphical representation of a high-energy, ion implantation distribution profile and a low-energy, ion implantation distribution profile, wherein the ion concentration $n(x)$ is plotted as ordinate versus the depth of ion implantation $(x)$ as abscissa.

Referring now to FIGURE 3, a high-energy implantation of tellurium ions in region 12 in a distribution profile 18 is prescribed to overlap a low-energy implantation of tellurium ions in a distribution profile 20, where ion concentration $n(x)$ is plotted against ion implantation depth $x$.

Figure 4:
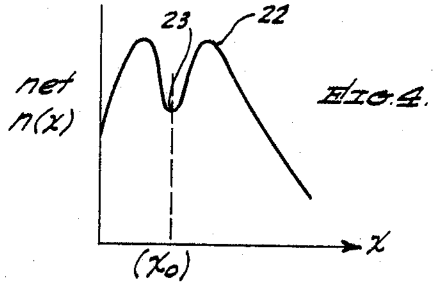
FIGURE 4 is a graphical representation of the composite, or net, distribution profiles of FIGURE 3, wherein the ordinate is net $n(x)$.

FIGURE 4 shows the composite, or net, concentration $n(x)$ plotted against depth $x$ for the distribution profiles 18 and 20, where the trough 23 at point $x_0$ is a point about which a capacitor can also be operated in a voltage-insensitive mode for small voltage ranges.

Figure 5:
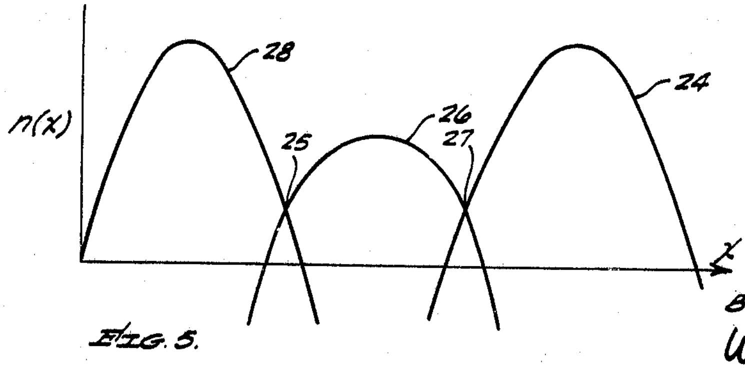
FIGURE 5 is a graphical representation of three ion implantation distribution profiles differing in combinations of the parameters of energy, concentration and time of ion implantation, wherein ordinates are as in FIGURES 3 and 4.

Referring now to FIGURE 5, distribution profiles 24, 26 and 28 are seen to form troughs 25 and 27, where profile 24 represents an implantation at the highest energy prescribed to produce a high dopant-concentration region deep in the substrate; profile 26 represents an implantation region at an intermediate energy prescribed to produce moderate dopant concentration regions at intermediate depths; and profile 28 represents an implantation region at the lowest energy prescribed to produce high dopant concentration relatively close to the substrate surface. As in the case of trough 23, troughs 25 and 27 are points about which a capacitor can be operated in a voltage-insensitive mode for small voltage ranges.

It is understood that in principle any number of ion implantations at intermediate energies could be made, in such manner, producing a digitalized, voltage-tunable capacitor.

As indicated previously, the present invention resides essentially in the unexpected discovery that in a varactor diode a non-injecting contact barrier on an ion-implanted substrate will produce and exhibit an inordinately large capacitance variation with minimal applied voltage. It is known in the art that when a voltage is applied between a non-injecting contact and a semiconductor material, a region is depleted of free carriers. It is further known that the depth of this region is determined by the integrated sum of all the dopant ions exposed by this depletion; hence the depth of depletion depends upon the number and distribution of dopant ions within the region immediately beneath the non-injecting contact.

The small signal capacitance, C, of such a depleted layer is to a close approximation determined by the relation $$C=\epsilon A/X$$

where $\epsilon$ is the permittivity of the substrate, A is dimensionally the non-injecting contact and X is the depth to which carriers are depleted by a given voltage. Hence the relationship of capacitance to applied voltage depends upon the concentration and distribution of dopant ions (indicated by $n(x)$ in FIGURES 3, 4 and 5) in the depleted sub-surface region.

Performance characteristics indicate an inordinately large capacitance variation even with voltage applied to an ion-implanted area as small as 0.05 millimeters square. Hence an even smaller area, as for example, a virtual point contact, is sufficient in certain applications.

Following are typical measured values of applied voltage expressed in volts and the corresponding capacitance expressed in picofarads, for a diode having an ion-implanted region with an area of 0.05 square millimeters:

| V (v.) | C ($\mu\mu$f.) |
|---|---|
| −.08 | 230 |
| −.01 | 182 |
| 0 | 178 |
| .1 | 130 |
| .15 | 111 |
| .2 | 96 |
| 1.0 | 2.1 |
| 2.0 | 12 |

It will be appreciated that for zero voltage, the capacitance value reads 178$\mu\mu$f., and that over a range of $\pm 0.1$ volt applied, the variation of capacitance relative to the initial value is substantially 50%—that is, $$\Delta C/C_0=100\ \mu\mu\text{f.}/178$$

Prior art varactor diode structures were not characterized by the performance features described above. It should be noted herewith that the varactor diode described is further characterized by inherent capabilities as a mixer and as an integratable capacitor useful in programable applications as a monolithic integrated circuit, a digital-to-analog converter or a flip-flop device.

From the above description and drawings it is apparent that departures from the specific embodiments herein disclosed may be made without essentially departing from the nature and scope thereof as may be covered by the following claims.

What is claimed is:

1. A diode having two electrodes and means disposed between said electrodes for producing voltage-dependent capacitance, said means including:

(a) a semiconductor substrate having a first type of conductivity;

(b) a surface-exposed, sub-surface region of said substrate having implanted conductivity-type impurity ions therein of the same conductivity-type;

(c) one of said electrodes contacting contiguously said sub-surface region only and being carrier non-injecting therewith;

(d) and the other of said electrodes being in ohmic contact with another surface of said substrate.

2. A diode having two electrodes and means disposed between said electrodes for producing a voltage-dependent capacitance, said means including:

(a) a semiconductor substrate having a first type of conductivity;

(b) a surface-exposed, sub-surface region of said substrate having implanted conductivity-type impurity ions therein of the same conductivity-type;
(c) one of said electrodes forming a pn-junction contact upon the exposed surface of said ion-implanted sub-surface region;
(d) and the other of said electrodes being in ohmic contact with another surface of said substrate.

3. A diode having two electrodes and means disposed between said electrodes for producing voltage-dependent capacitance, said means including:
(a) a semiconductor substrate having a first type of conductivity;
(b) a surface-exposed, substrate region of said substrate having implanted conductivity-type impurity ions therein of the same conductivity-type;
(c) one of said electrodes forming a surface barrier upon said substrate contiguous to said sub-surface region;
(d) and the other of said electrodes being in ohmic contact with another surface of said substrate.

4. A varactor diode having two electrodes and means disposed between said electrodes for producing voltage-dependent capacitance, said means including:
(a) an N-type substrate;
(b) a surface-exposed sub-surface region of said substrate having implanted N-type ions as dopant thereof;
(c) one of said electrodes comprising a metallic barrier evaporated upon said substrate contiguous to said sub-surface ion-implanted region and being non-injecting therewith;
(d) and the other of said electrodes being in ohmic contact with another surface of said substrate.

5. The invention according to claim 4 wherein said substrate is selected from the group consisting of gallium arsenide, germanium and silicon.

6. The invention according to claim 4 wherein said sub-surface region of said substrate is implanted with ions of an N-type element of Group VI in the Periodic Table of Elements.

7. The invention according to claim 4 wherein said sub-surface region of said substrate is implanted with tellurium (Te) ions.

8. The invention according to claim 4 wherein the metallic barrier evaporated upon said substrate is gold (Au).

9. A diode having two electrodes and means disposed between said electrodes for producing voltage-dependent capacitance, said means including:
(a) a semiconductor substrate having a first type of conductivity;
(b) a surface-exposed sub-surface region of said substrate having implanted conductivity-type impurity ions therein of the same conductivity-type, and wherein the ion-implanted depth comprises at least two regions of ion implantation differing from one another in concentration;
(c) one of said electrodes contacting contiguously said sub-surface region only and being carrier non-injecting therewith;
(d) and the other of said electrodes being in ohmic contact with another surface of said substrate.

10. The invention according to claim 9 wherein the ion-implanted depth comprises at least three regions of ion implantation.

11. The invention according to claim 9 wherein the ion-implanted depth is on the order of one-tenth micron ($0.1\mu$).

12. A varactor diode having two electrodes and means disposed between said electrodes for producing voltage-dependent capacitance, said means including:
(a) a P-type substrate;
(b) a surface-exposed, sub-surface region of said substrate having implanted P-type ions as dopant thereof;
(c) one of said electrodes comprising a metallic barrier evaporated upon said substrate contiguous to said sub-surface ion-implanted region and being non-injecting therewith;
(d) and the other of said electrodes being in ohmic contact with another surface of said substrate.

13. The invention according to claim 12 wherein said metallic barrier is aluminum.

14. A varactor diode having two electrodes and means disposed between said electrodes for producing voltage-dependent capacitance, said means including:
(a) a P-type substrate;
(b) a surface-exposed, sub-surface region of said substrate having implanted P-type ions as dopant thereof;
(c) one of said electrodes forming an np-junction contact upon the exposed surface of said ion-implanted sub-surface region;
(d) and the other of said electrodes being in ohmic contact with another surface of said substrate.

15. The invention according to claim 14 wherein said np-junction is such that an electric field may be applied thereacross without substantial current.

References Cited

UNITED STATES PATENTS

| | | | |
|---|---|---|---|
| 2,666,814 | 1/1954 | Shockley | 317—235 |
| 3,126,509 | 3/1964 | Pulvari | 317—234 X |
| 3,317,354 | 5/1967 | Darrow et al. | 317—234 X |
| 3,341,754 | 9/1967 | Kellett et al. | 317—235 X |
| 3,383,567 | 5/1968 | King et al. | 317—234 |
| 3,413,531 | 11/1968 | Leith | 317—235 |

JAMES D. KALLAM, Primary Examiner